(12) United States Patent
Norito

(10) Patent No.: US 7,003,408 B2
(45) Date of Patent: Feb. 21, 2006

(54) HYSTERESIS CHARACTERISTIC SETTING DEVICE AND HYSTERESIS CHARACTERISTIC SETTING METHOD

(75) Inventor: Yasuji Norito, Osaka (JP)

(73) Assignee: Koyo Seiko Co., Ltd., Osaka (JP)

( * ) Notice: Subject to any disclaimer, the term of this patent is extended or adjusted under 35 U.S.C. 154(b) by 12 days.

(21) Appl. No.: 10/668,254

(22) Filed: Sep. 24, 2003

(65) Prior Publication Data

US 2004/0064279 A1    Apr. 1, 2004

(30) Foreign Application Priority Data

Sep. 26, 2002   (JP)   ............ P2002-281262

(51) Int. Cl.
*G01R 35/00*   (2006.01)

(52) U.S. Cl. ...................................... 702/57

(58) Field of Classification Search .............. 702/57, 702/145; 318/254; 324/433, 522, 537, 251; 713/1; 606/41, 34, 37; 340/310; 250/349; 320/112; 396/129; 327/72, 206; 323/235; 84/464; 332/101; 363/21
See application file for complete search history.

(56) References Cited

U.S. PATENT DOCUMENTS

| | | | |
|---|---|---|---|
| 3,642,329 A | | 2/1972 | Zechnall et al. |
| 5,752,100 A | * | 5/1998 | Schrock .................. 396/129 |
| 5,949,197 A | * | 9/1999 | Kastner .................. 315/291 |
| 6,134,655 A | * | 10/2000 | Davis ....................... 713/1 |
| 6,163,190 A | * | 12/2000 | Takai et al. ............. 327/205 |
| 6,188,206 B1 | * | 2/2001 | Nguyen et al. ......... 323/222 |
| 6,198,239 B1 | | 3/2001 | Blackburn |
| 6,304,088 B1 | | 10/2001 | Yee |
| 6,366,069 B1 | * | 4/2002 | Nguyen et al. ......... 323/282 |

FOREIGN PATENT DOCUMENTS

| | | |
|---|---|---|
| FR | 2 817 970 | 6/2002 |
| JP | 5-28521 | 7/1993 |
| JP | 10-197572 | 7/1998 |

OTHER PUBLICATIONS

European Search Report dated Jan. 14, 2004.
"Voltage Comparator Circuit", IBM Technical Disclosure Bulletin, vol. 17, No. 4, Sep. 1974, pp. 1151-1152, XP-002265879.

* cited by examiner

*Primary Examiner*—Bryan Bui
*Assistant Examiner*—Tung S. Lau
(74) *Attorney, Agent, or Firm*—McGinn IP Law Group, PLLC

(57) ABSTRACT

For providing a hysteresis characteristic setting device configured by components smaller in number than those of a logic circuit or a comparator circuit for setting a hysteresis characteristic, the device comprises a resistor voltage dividing circuit including two resistors; and a microcomputer including first and second ports and serving as input ports. When an output signal from a low-pass filter circuit is supplied to the device, the voltage of the signal is divided by the two resistors of the resistor voltage dividing circuit and then given to the second port. The microcomputer performs a process according to a combination of levels Hi and Lo detected in the ports, to set a hysteresis characteristic in which an input voltage level corresponding to a threshold voltage level of the first port is a lower limit, and that corresponding to a threshold voltage level of the second port is an upper limit.

22 Claims, 3 Drawing Sheets

FIG. 1
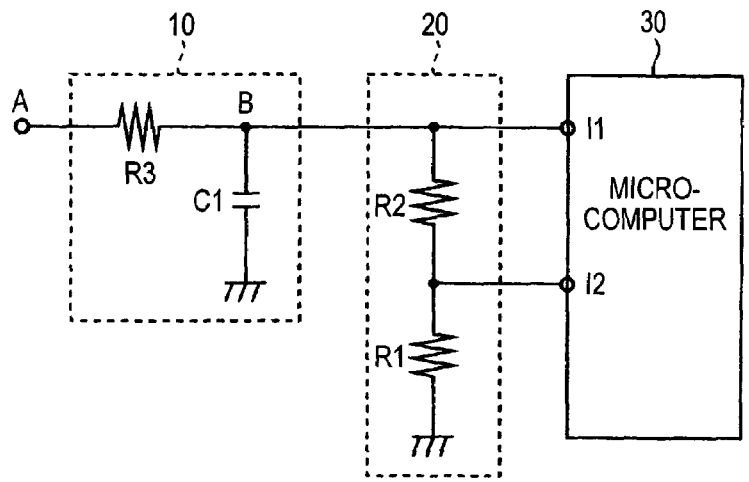
FIG. 2A
FIG. 2B
FIG. 3
| INPUT VOLTAGE | I1 | I2 | PROCESS RESULT |
|---|---|---|---|
| $V_i \geq (1 + R2/R1) \cdot V_{th}$ | Hi | Hi | Hi |
| $(1 + R2/R1) \cdot V_{th} > V_i \geq V_{th}$ | Hi | Lo | UNCHANGED |
| $V_{th} > V_i$ | Lo | Lo | Lo |

HYSTERESIS CHARACTERISTIC SETTING DEVICE AND HYSTERESIS CHARACTERISTIC SETTING METHOD

BACKGROUND OF THE INVENTION

1. Field of the Invention

The present invention relates to a hysteresis characteristic setting device and a method, and more particularly to a device and a method for setting a hysteresis characteristic with respect to an input signal in order to prevent, for example, noises from being detected as an input signal.

2. Description of the Related Art

Conventionally, as a circuit for setting a hysteresis characteristic with respect to an input signal in order to prevent noises from being detected as an input signal, known are a logic circuit and a comparator circuit which have a hysteresis characteristic as typified by a Schmitt trigger circuit.

FIG. 5 exemplarily shows the configuration of a Schmitt trigger circuit consisting of an operational amplifier and plural resistors. The Schmitt trigger circuit outputs an H-level signal when the voltage of an input signal is lower than a preset upper limit (of a hysteresis voltage), and outputs an L-level signal when the input signal voltage is higher than the upper limit. Thereafter, the circuit continues to output the L-level signal when the input signal voltage is higher than a preset lower limit (of the hysteresis voltage), and outputs the H-level signal when the input signal voltage is lower than the lower limit. In this way, in the Schmitt trigger circuit, when the input signal voltage is once higher than the upper limit, the level of the output signal is not changed as long as the voltage becomes lower than the lower limit. Similarly, when the input signal voltage is once lower than the lower limit, the level of the output signal is not changed as long as the voltage becomes higher than the upper limit. In the specification, the operation is referred to as an operation of setting a hysteresis characteristic with respect to an input signal, and a device for performing the operation is referred to as a hysteresis characteristic setting device. The operation of setting a hysteresis characteristic prevents an effect due to a voltage change of the input signal caused by noises (specifically, a voltage change to the upper limit when the input signal voltage is raised, or that to the lower limit when the voltage is lowered) from being produced. Therefore, noises are eliminated from the input signal. The waveform of the input signal may be shaped into a rectangular one by the operation.

Patent literature 1: JP-UM-B-5-28521

As described above, a logic circuit or a comparator circuit which sets a hysteresis characteristic as typified by a Schmitt trigger circuit is configured by an operational amplifier or transistors and resistors. Therefore, such a circuit has a large number of components, with the result that the production cost is increased and a large installation space is required.

It is an object of the invention to provide a hysteresis characteristic setting device configured by components which are smaller in number than those of a logic circuit or a comparator circuit for setting a hysteresis characteristic.

SUMMARY OF THE INVENTION

In a first invention, the device is a device for setting a hysteresis characteristic with respect to an input signal, wherein the device comprises:

a voltage dividing circuit which divides a voltage of the input signal into a first voltage and a second voltage which is lower than the first voltage; and a computer including a first port to which the first voltage is given, and a second port to which the second voltage is given, the computer performing a predetermined software process to set a hysteresis characteristic, and the computer performs a software process of: when the voltages given to the first and second ports are equal to or higher than a predetermined threshold, determining the input signal to have a high level; when the voltage given to the first port is equal to or higher than the threshold and the voltage given to the second port is lower than the threshold, making a same determination as a immediately preceding determination; and, when the voltages given to the first and second ports are lower than the predetermined threshold, determining the input signal to have a low level.

The first invention is configured so that the voltage of the input signal is divided by the voltage dividing circuit to set input voltage levels corresponding to threshold voltages serving as upper and lower limits of a hysteresis voltage, and the hysteresis characteristic based on the upper and lower limits is set by the software process in the computer. According to the configuration, the hysteresis characteristic can be set by a smaller number of components and without using a circuit which has a large number of components as typified by a Schmitt trigger circuit.

In a second invention, in the device of the first invention, the voltage dividing circuit includes first and second resistors which are connected to each other in series, the input signal is given to one end of the first resistor, the first port is connected to the one end of the first resistor, one end of the second resistor and the second port are connected to another end of the first resistor, and another end of the second resistor is grounded.

According to the second invention, the voltage dividing circuit is configured only by the two resistors. Therefore, a hysteresis characteristic can be set in the input signal by simply adding two components to the computer.

BRIEF DESCRIPTION OF THE DRAWINGS

FIG. 1 is a diagram showing the configurations of a hysteresis characteristic setting device and a low-pass filter circuit in an embodiment of the invention;

FIGS. 2A and 2B are charts showing signal waveforms at points A and B of FIG. 1 in the embodiment;

FIG. 3 is a view showing a table listing results of detections in first and second ports corresponding to an input voltage in the embodiment, and those of a software process;

Figure 4A:
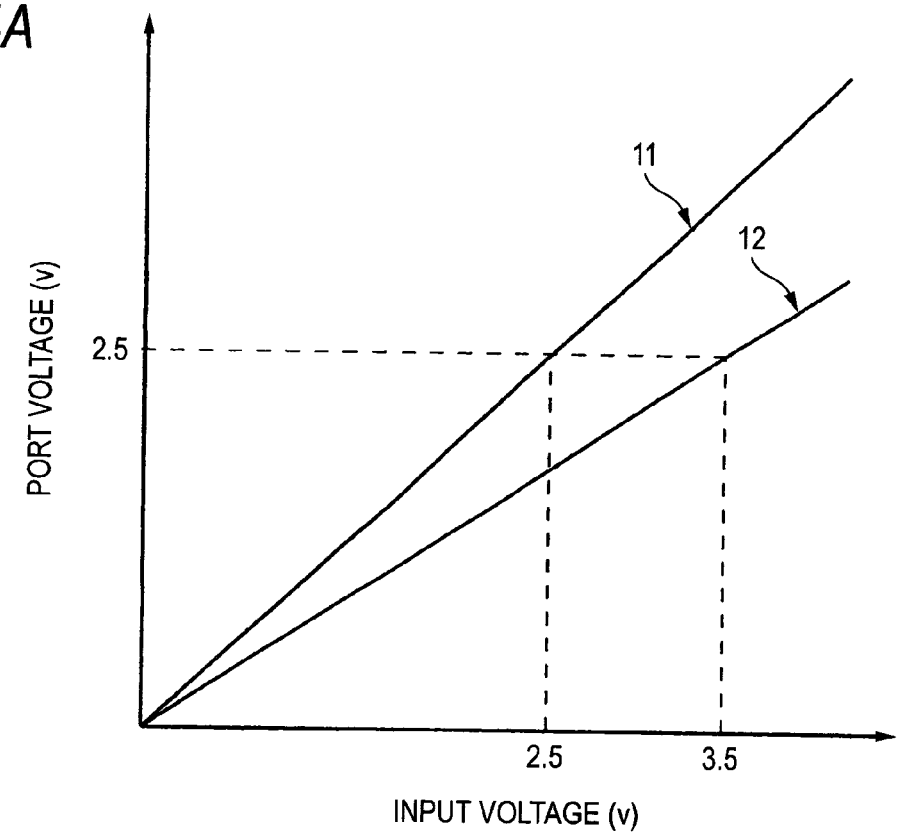
FIGS. 4A to 4C are views illustrating the operation of the hysteresis characteristic setting device of the embodiment.

In the figures, the reference numeral 10 refers to a low-pass filter circuit; 20 to a resistor voltage dividing circuit; and 30 to a microcomputer. The reference sign I1 to a first port; I2 to a second port; each of R1 to R3 to a resistor; and C1 to a capacitor.

DETAILED DESCRIPTION OF THE PREFERRED EMBODIMENTS

Hereinafter, an embodiment of the invention will be described with reference to the accompanying drawings.

<1. Whole Configuration>

FIG. 1 shows the configurations of a hysteresis characteristic setting device and a low-pass filter circuit in an embodiment of the invention. The hysteresis characteristic setting device comprises a resistor voltage dividing circuit 20, and a microcomputer (hereinafter, abbreviated to "microcomputer") 30 including first and second ports I1 and I2 serving as input ports. A signal output from the low-pass filter circuit 10 is supplied to the device.

The low-pass filter circuit 10 is configured by a resistor R3 and a capacitor C1. An input signal is given to one end (the point A in the figure) of the resistor R3, and an output signal is given from the other end (the point B in the figure) of the resistor to the hysteresis characteristic setting device. The other end of the resistor R3 is grounded through the capacitor C1. According to the configuration, high-frequency signal components in the input signal are eliminated. The above-described configuration of the low-pass filter circuit 10 is a mere typical example. The configuration of the circuit is not restricted to the above-described one as far as the circuit can eliminate high-frequency signal components. Hereinafter, the circuit will be described with reference to a specific signal waveform chart.

FIGS. 2A and 2B are charts showing signal waveforms at the points A and B. The input signal at the point A which is shown in FIG. 2A contains a noise due to chattering. The noise due to chattering is a noise signal which is produced when two contacts of a contact switch, a contact speed sensor, or the like contact with or separate from each other (i.e., when the ON/OFF state is changed over). In the noise signal, the voltage level is heavily varied in a short time period, and hence high-frequency signal components are contained. When the input signal is given to (the point A of) the low-pass filter circuit 10, therefore, the output signal does not contain high-frequency signal components as in the signal waveform in the point B shown in FIG. 2B. The output signal is given to the resistor voltage dividing circuit 20 of the hysteresis characteristic setting device.

The resistor voltage dividing circuit 20 is configured by resistors R1, R2. The signal from the low-pass filter circuit 10 is given to one end of the resistor R2. The one end of the resistor R2 is connected to the first port I1 of the microcomputer 30, the other end of the resistor R2 is connected to one end of the resistor R1 and also to the second port I2 of the microcomputer 30, and the other end of the resistor R1 is grounded. According to the configuration, the signal voltage (hereinafter, referred to as "input voltage") from the low-pass filter circuit 10 is directly applied to the first port I1, and the voltage obtained as a result of division of the voltage is applied to the second port I2. Namely, when the input voltage is indicated by Vi, a voltage of Vi is given to the first port I1, and that of $(R1/(R1+R2))\cdot Vi$ is given to the second port I2. When a threshold voltage level which is an inherent input threshold of the first and second ports I1 and I2 is indicated by Vth, therefore, the input voltage level corresponding to the threshold voltage level of the first port I1 is Vth or equal to the threshold voltage level, and that corresponding to the threshold voltage level of the second port I2 is $(1+(R2/R1))\cdot Vth$ because the input voltage level is subjected to the voltage division. In the above, R1 and R2 indicate the resistances of the resistors R1, R2, respectively, and the threshold voltage level means a voltage level serving as a threshold for determining whether an input digital signal is at a high level (hereinafter, abbreviated to "Hi") or at a low level (hereinafter, abbreviated to "Lo"). In the first and second ports I1 and I2, therefore, the given voltage is detected as Hi when the voltage is equal to or higher than the threshold voltage level, and as Lo when the voltage is lower than the threshold voltage level.

The microcomputer 30 is a computer which performs a software process based on stored programs, such as a microcomputer included in, for example, an in-vehicle electronic control unit (ECU). In the embodiment, the microcomputer performs a software process of setting a hysteresis characteristic on the basis of a combination of Hi and Lo which are detected in the first and second ports I1 and I2. The software process will be described with reference to the figures.

<2. Software Process by Microcomputer>

FIG. 3 shows a table listing results of detections in the first and second ports I1 and I2 in response to the input voltage, and those of the software process. As shown in the figure, in the embodiment, the software process is performed so as to correspond to three cases in accordance with the level of the input voltage. Hereinafter, the contents of the software process in the three cases will be described.

In the first case where the input voltage Vi is equal to or higher than $(1+(R2/R1))\cdot Vth$, the input voltage has a level which is equal to or higher than the input voltage levels corresponding to the threshold voltage levels of the first and second ports I1 and I2. In both the first and second ports I1 and I2, therefore, Hi is detected. When Hi is detected in both the first and second ports I1 and I2, the microcomputer 30 performs the software process so as to output Hi as a process result. The process is performed on the basis of a simple conditional or logical expression. The result of the process is stored into a predetermined memory region.

In the second case where the input voltage Vi is equal to or higher than Vth and lower than $(1+(R2/R1))\cdot Vth$, the input voltage is equal to or higher than the input voltage level corresponding to the threshold voltage level of the first port I1, and lower than that corresponding to the threshold voltage level of the second port I2. Therefore, Hi is detected in the first port I1 and Lo is detected in the second port I2. When Hi is detected in the first port I1 and Lo is detected in the second port I2, the microcomputer 30 performs the software process so as to maintain the result (the level of Hi or Lo) of the immediately preceding process, as a process result. Namely, the microcomputer 30 outputs the level of Hi or Lo stored in the predetermined memory region, as it is or without changing the level.

In the third case where the input voltage Vi is lower than Vth, the input voltage is lower than the input voltage levels corresponding to the threshold voltage levels of the first and second ports I1 and I2. In both the first and second ports I1 and I2, therefore, Lo is detected. When Lo is detected in both the first and second ports I1 and I2, the microcomputer 30 performs the software process so as to output Lo as a process result. The process is performed on the basis of a simple conditional or logical expression. Also the result of the process is stored into the predetermined memory region.

As described above, the hysteresis characteristic setting device is configured so that the voltage obtained by the voltage division in the resistor voltage dividing circuit 20 is given to the second port I2, and the software process is performed to set the range of $(R2/R1)\cdot Vth$ in which the upper limit is $(1+(R2/R1))\cdot Vth$ and the lower limit is Vth, as the hysteresis voltage. The operation of the hysteresis characteristic setting device will be described with exemplarily using specific values.

Figure 4B:
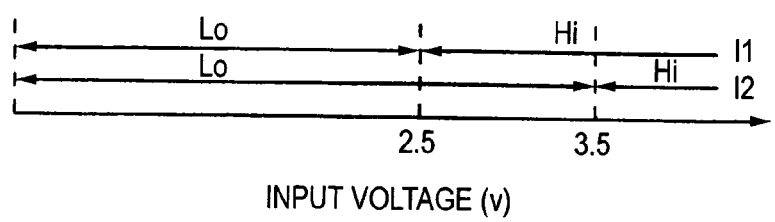
Figure 4C:
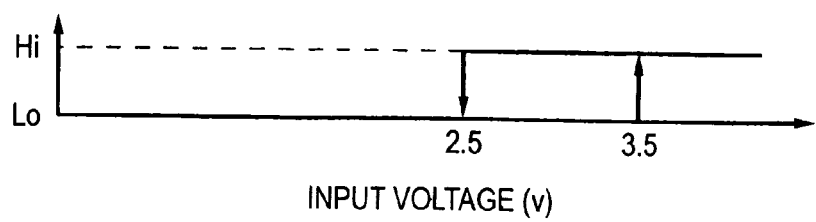
Figure 5:
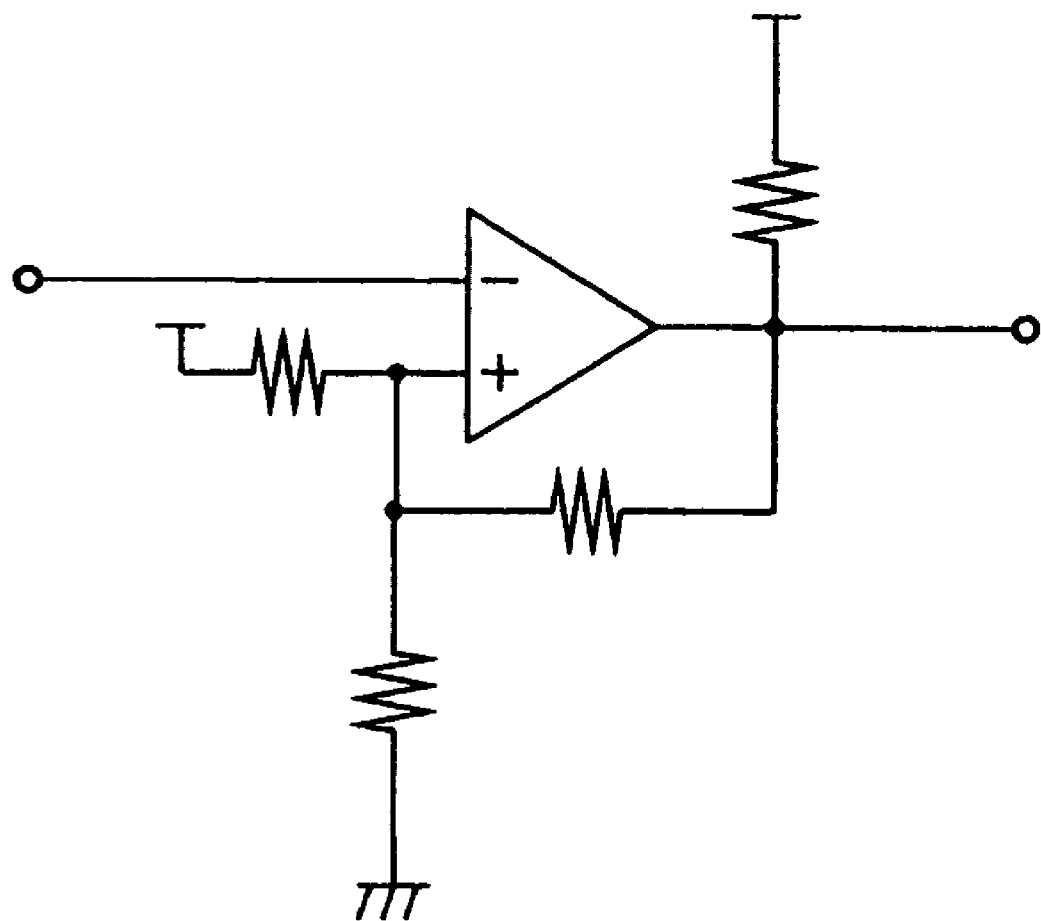
FIG. 5 is a diagram exemplarily showing the configuration of a conventional Schmitt trigger circuit.

FIGS. 4A to 4C are views illustrating the operation of the hysteresis characteristic setting device. FIG. 4A shows relationships between the voltages given to the first and second ports I1 and I2 (hereinafter, such a voltage is referred to as "port voltage"), and the input voltage, in the form of a graph. The resistor R1 of the resistor voltage dividing circuit 20 has a resistance of 2.5 kΩ, the resistor R2 has a resistance of 1 kΩ, and the threshold voltage level Vth of the ports is 2.5 V. As shown in FIG. 4A, when the input voltage is 3.5 V, the voltage level given to the second port I2 is 2.5 V as a result of the voltage division, and hence the input voltage level corresponding to the threshold voltage level of the second port I2 is 3.5 V. The relationships in which the input voltage level corresponding to the threshold voltage level of the first port I1 is 2.5 V, and that corresponding to the threshold voltage level of the second port I2 is 3.5 V can be derived also from the above-mentioned relational expression.

FIG. 4B shows relationships between the levels of Hi or Lo detected in the first and second ports I1 and I2, and the input voltage. The input voltage level corresponding to the threshold voltage level of the first port I1 is 2.5 V, and that corresponding to the threshold voltage level of the second port I2 is 3.5 V. Consequently, there arises a difference of 1 V between the levels, and a difference of 1 V is similarly produced in the range of the detection of Hi or Lo in the ports. The software process is performed while setting the upper limit to 3.5 V and the lower limit to 2.5 V so that the range becomes equal to the hysteresis voltage.

FIG. 4C shows relationships between a result of the software process and the input voltage. In the case where the input voltage is being raised, the process result is kept to Lo until the input voltage reaches the upper limit of 3.5 V or higher. In the case where the input voltage is being lowered, the process result is kept to Hi until the input voltage reaches the lower limit of 2.5 V or lower. As a result, a hysteresis characteristic setting device having a hysteresis voltage of 1 V is configured.

As described above, the hysteresis characteristic setting device has a configuration in which the input voltage levels corresponding to threshold voltages serving as the upper and lower limits of a hysteresis characteristic are set by the resistor voltage dividing circuit 20, and the hysteresis characteristic based on the upper and lower limits is set by the software process in the microcomputer 30. According to the configuration, an effect due to a voltage change of the input signal caused by noises (a voltage change to the upper limit when the voltage is raised, or that to the lower limit when the voltage is lowered) is not produced. Therefore, noises are eliminated from the input signal.

<3. Modifications>

In the hysteresis characteristic setting device of the embodiment, the low-pass filter circuit 10 is disposed in front of the input side. In the case where the input signal contains a noise due to variation of the ground potential, for example, it is not required to eliminate high-frequency signal components, and hence the low-pass filter circuit 10 may be omitted. For example, a noise due to variation of the ground potential is produced by a phenomenon that the ground potential of an in-vehicle electrical device is usually different from that of an in-vehicle sensor and hence the ground potential of the in-vehicle sensor is instantaneously varied by an ON/OFF operation of the in-vehicle electrical device.

In the hysteresis characteristic setting device of the embodiment, the resistor voltage dividing circuit 20 is configured by the two resistors R1, R2. Alternatively, the circuit may be configured by three resistors which are connected to one other in series. In the alternative, voltages may be given from the two junctions of the resistors to the first and second ports I1 and I2, respectively. According to the configuration, when the resistances of the resistors are set to adequate values, appropriate voltages can be given to the ports. The resistor voltage dividing circuit 20 is configured by resistors. As far as a voltage can be divided, alternatively, the circuit may be configured by members having a DC resistance other than resistors, or so as to divide the voltage of a signal which is amplified by a transistor.

<4. Effect>

According to the embodiment, the signal from the low-pass filter circuit 10 is divided by the resistor voltage dividing circuit 20 to set the input voltage levels corresponding to the threshold voltages serving as the upper and lower limits of a hysteresis voltage, and the hysteresis characteristic based on the upper and lower limits is set by the software process in the microcomputer 30. According to the configuration, a hysteresis characteristic can be set by a smaller number of components (specifically, only two resistors) and without using a circuit which has a large number of components, and which is typified by a Schmitt trigger circuit.

What is claimed is:

1. A device for setting a hysteresis characteristic with respect to an input signal, said device comprising:
   a voltage dividing circuit for dividing a voltage of said input signal into a first voltage and a second voltage which is lower than said first voltage; and
   a computer including
      a first port to which said first voltage is given; and
      a second port, that is separate from said first port, to which said second voltage is given, said computer performing a predetermined software process to set a hysteresis characteristic;
   wherein said computer performs a software process of:
      when said voltages given to said first and second ports are equal to or higher than a predetermined threshold, determining said input signal to have a high level;
      when said voltage given to said first port is equal to or higher than the threshold and said voltage given to said second port is lower than the threshold, determining said input signal to have the same level as an earlier determination; and
      when said voltages given to said first and second ports are lower than the predetermined threshold, determining said input signal to have a low level.

2. The device for setting a hysteresis characteristic according to claim 1,
   wherein said voltage dividing circuit includes first and second resistors which are connected to each other in series,
   wherein a first end of said first resistor is connected to said first port, a second end of said first resistor is connected to a first end of said second resistor and said second port, said input signal is input to said first end of said first resistor, and
   wherein a second end of said second resistor is grounded.

3. A device for setting a hysteresis characteristic with respect to an input signal, said device comprising:
   a pre-processing section for reducing a noise of said input signal;
   a voltage dividing section for dividing a voltage of said pre-processed input signal into a first signal and a second signal;
   a characteristic setting section including
      a first comparator for comparing said first signal with a predetermined threshold, and
      a second comparator for comparing said second signal with said predetermined threshold, for setting a hysteresis characteristic based on results of said first comparator and second comparator;

wherein said voltage dividing section divides said pre-processed input signal so that a voltage of said second signal is lower than a voltage of said first signal, and wherein said setting section sets a hysteresis characteristic in such manner that:

when both of said first signal and said second signal are equal to or higher than said predetermined threshold, said setting section outputs a high level signal;

when both of said first signal and said second signal are lower than said predetermined threshold, said setting section outputs a low level signal; and when said first signal is equal to or higher than said predetermined threshold and said second signal is lower than said predetermined threshold, said setting section outputs a same level signal as an earlier output signal.

4. The hysteresis characteristic setting device according to claim 3, wherein said voltage dividing section includes at least two resistors connected in series with each other.

5. The hysteresis characteristic setting device according to claim 3, wherein said voltage dividing section includes three resistors connected in series.

6. The hysteresis characteristic setting device according to claim 3, wherein said pre-processing section comprises a low-pass filter.

7. A method for setting a hysteresis characteristic in respect to an input signal, said method comprising:

pre-processing for reducing a noise of said input signal;

voltage dividing for dividing said pre-processed input signal into a first signal and a second signal, which is lower than said first signal;

first comparing for comparing said first signal with a predetermined threshold;

second comparing for comparing said second signal with said predetermined threshold; and characteristic setting for setting a hysteresis characteristic based on said first comparing and second comparing;

wherein said characteristic setting comprises:

said hysteresis characteristic of said input signal is defined as a high level of output signal in a case that said first signal is equal to or higher than said predetermined signal in a result of said first comparing and said second signal is equal to or higher than said predetermined threshold in a result of said second comparing, said hysteresis characteristic of said input signal is defined as a low level of output signal in a case that said first signal is lower than said predetermined threshold in the result of said first comparing and said second signal is lower than said predetermined threshold in the result of said second comparing, and said hysteresis characteristic of said input signal is defined as the same as an earlier output signal in a case that said first signal is equal to or higher than said predetermined threshold in the result of said first comparing and said second signal is lower than said predetermined threshold in the result of said second comparing.

8. The method according to claim 7, wherein said hysteresis characteristic of said input signal comprises an output signal and wherein said method further comprises:

recording said output signal of said characteristic setting into a memory when said output signal is different from a previous output signal.

9. The method according to claim 7, wherein said voltage dividing is executed by at least two resistors connected in series with each other.

10. The method according to claim 7, wherein said pre-processing is executed by a low-pass filter.

11. A device for setting a hysteresis characteristic with respect to an input signal, said device comprising:

a voltage divider receiving said input signal and outputting said input signal as a first voltage and outputting a second voltage that is less than said first voltage; and a computer that:

determines a high level exists when said first voltage and said second voltage are both equal to or higher than a predetermined threshold, determines a low level exists when said first voltage and said second voltage are both lower than said predetermined threshold, and determines a same level as an earlier determination exists when said first voltage is equal to or higher than said predetermined threshold and said second voltage is lower than said predetermined threshold.

12. The device of claim 11, wherein said computer receives said input signal as said first signal on a first port and receives said second voltage on a second port.

13. The device of claim 11, further comprising a filter that provides a filtered input signal as said input signal to said voltage divider.

14. The device of claim 13, wherein said filter comprises a low-pass filter.

15. The device of claim 11, wherein said voltage divider comprises a first resistor connected in series with a second resistor.

16. The device of claim 11, wherein said computer further records an output signal based upon at least one of said determinations.

17. A method for setting a hysteresis characteristic with respect to an input signal, the method comprising:

dividing said input signal, using a voltage divider circuit, into a first signal and a second signal;

determining that a high level exists when said first signal and said second signal are equal to or higher than said predetermined threshold;

determining that a low level exists when said first signal and said second signal are less than said predetermined threshold; and determining that a same level as an earlier determination exists when said first voltage is equal to or higher than said predetermined threshold and said second voltage is lower than said predetermined threshold.

18. The method of claim 17, further comprising:

comparing said first signal with a predetermined threshold; and comparing said second signal with said predetermined threshold.

19. The method of claim 17, further comprising filtering said input signal.

20. The method of claim 19, wherein said filtering of said input signal occurs before said dividing of said input signal.

21. The method of claim 17, further comprising recording an output signal based upon results of said determining.

22. The method of claim 17, wherein said first signal and said second signal are provided, respectively, as input signals to a first port and a second port of a computer and said determining is achieved by said computer.

* * * * *